United States Patent
Yoshiaki et al.

(10) Patent No.: US 9,209,051 B2
(45) Date of Patent: Dec. 8, 2015

(54) MOUNTING APPARATUS AND MOUNTING METHOD FOR FLIP CHIP BONDING SEMICONDUCTOR CHIPS USING TWO-STEP PRESSING PROCESS

(71) Applicant: Samsung Electronics Co., Ltd., Suwon-Si, Gyeonggi-Do (KR)

(72) Inventors: Yukimori Yoshiaki, Yokohama (JP); Kajinami Masato, Yokohama (JP); Ueyama Shinji, Yokohama (JP)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 42 days.

(21) Appl. No.: 14/096,523

(22) Filed: Dec. 4, 2013

(65) Prior Publication Data

US 2014/0154838 A1    Jun. 5, 2014

(30) Foreign Application Priority Data

Dec. 4, 2012    (JP) ................. 2012-265493

(51) Int. Cl.
| | |
|---|---|
| H01L 21/00 | (2006.01) |
| H01L 21/67 | (2006.01) |
| H01L 21/68 | (2006.01) |
| H01L 23/00 | (2006.01) |

(52) U.S. Cl.
CPC ........ *H01L 21/67144* (2013.01); *H01L 21/681* (2013.01); *H01L 24/75* (2013.01); *H01L 24/81* (2013.01); *H01L 24/97* (2013.01); *H01L 2224/16145* (2013.01); *H01L 2224/16225* (2013.01); *H01L 2224/32145* (2013.01); *H01L 2224/32225* (2013.01); *H01L 2224/73204* (2013.01); *H01L 2224/73253* (2013.01); *H01L 2224/7598* (2013.01); *H01L 2224/75252* (2013.01); *H01L 2224/75753* (2013.01); *H01L 2224/81123* (2013.01); *H01L 2224/81203* (2013.01); *H01L 2224/81815* (2013.01); *H01L 2225/06568* (2013.01); *H01L 2924/15311* (2013.01)

(58) Field of Classification Search
CPC ................................ H01L 23/00; H01L 21/67
USPC ........................................ 438/108; 156/583.1
See application file for complete search history.

(56) References Cited

U.S. PATENT DOCUMENTS

| | | | | |
|---|---|---|---|---|
| 5,863,814 | A * | 1/1999 | Alcoe et al. | 438/117 |
| 8,273,605 | B2 * | 9/2012 | Tasaki et al. | 438/118 |
| 8,292,159 | B2 | 10/2012 | Maki et al. | |
| 2010/0127377 | A1 * | 5/2010 | Bauer et al. | 257/690 |

(Continued)

FOREIGN PATENT DOCUMENTS

JP    2005-093838    4/2005

*Primary Examiner* — Caleb Henry
(74) *Attorney, Agent, or Firm* — Harness, Dickey & Pierce, P.L.C.

(57) ABSTRACT

In one embodiment the mounting apparatus mounts an upper chip on a lower chip, and thermally presses the upper chip with the lower chip. The mounting apparatus includes a first movement part for mounting the upper chip on the lower chip and preliminarily bonding by thermal pressing, and a second movement part for mainly bonding the plurality of upper chips preliminarily bonded with the plurality of lower chips for a longer time. The second movement part thermally presses the upper chips preliminarily bonded on the lower chip in a state that the upper chips are adsorbed on an adsorption surface parallel to a loading surface of the lower chip on which the upper chips are loaded.

13 Claims, 5 Drawing Sheets

(56) References Cited

U.S. PATENT DOCUMENTS

| | | | |
|---|---|---|---|
| 2012/0222808 A1* | 9/2012 | Hamazaki | 156/297 |
| 2012/0279653 A1* | 11/2012 | Matsumura | 156/306.6 |
| 2013/0153644 A1* | 6/2013 | Hojo et al. | 228/102 |
| 2014/0013595 A1* | 1/2014 | Hong | 29/825 |

* cited by examiner

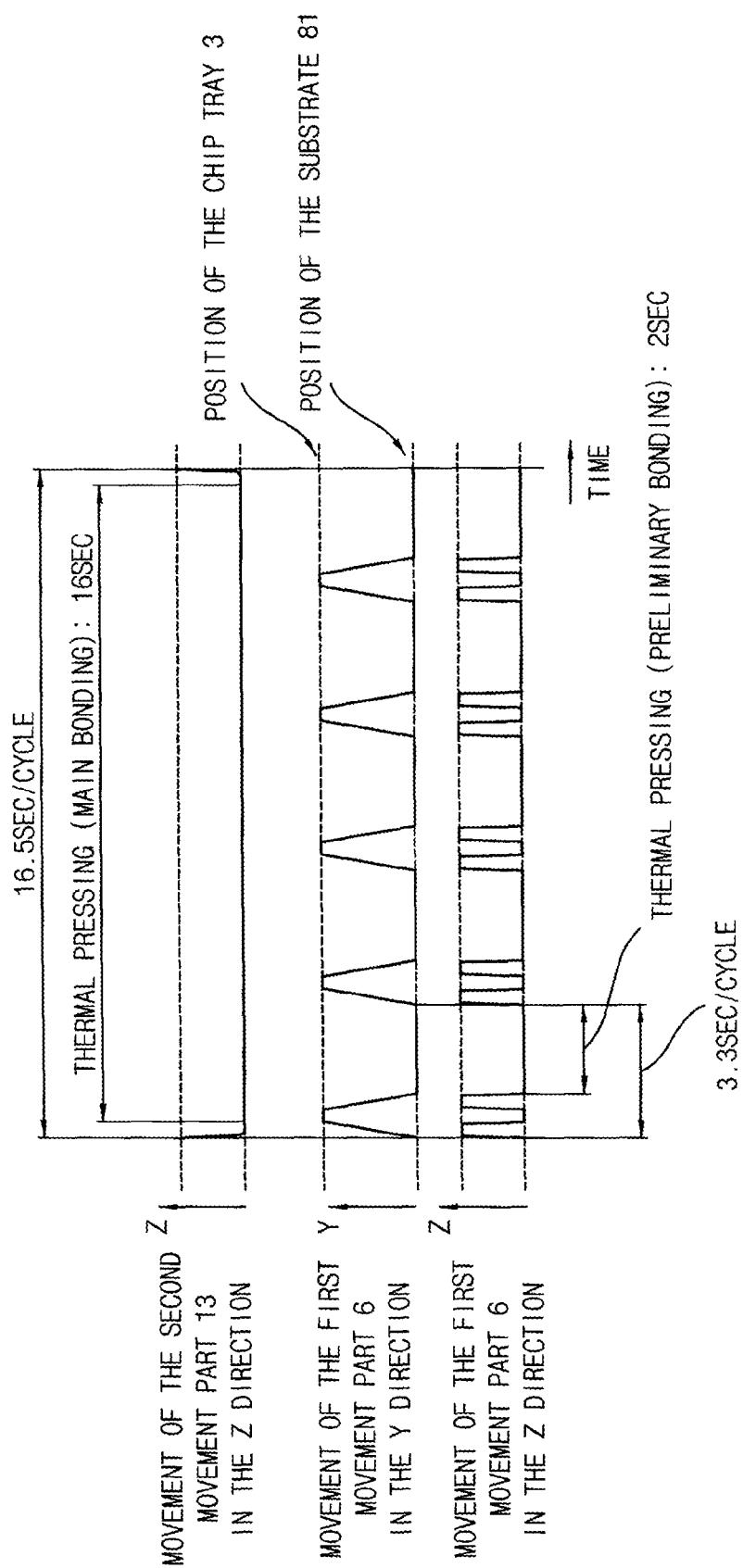

MOUNTING APPARATUS AND MOUNTING METHOD FOR FLIP CHIP BONDING SEMICONDUCTOR CHIPS USING TWO-STEP PRESSING PROCESS

CROSS-REFERENCE TO RELATED APPLICATION

This application claims priority under 35 U.S.C. §119 to Japanese Patent Application No. 2012-265493, filed on Dec. 4, 2012 in the Japanese Intellectual Property Office, the contents of which are herein incorporated by reference in their entirety.

BACKGROUND

1. Field

Example embodiments relate to an apparatus for mounting a semiconductor chip on a substrate and a method for mounting using the same.

2. Description of the Related Art

A flip chip connection that may be used for connecting semiconductor chips in a three-dimensional mounting or for mounting a semiconductor chip on a substrate may use a plurality of conductive bumps arranged in an array and connect chips and chips or chips and a substrate electrically and mechanically. As a method of mounting a plurality of chips on a substrate using a flip chip connection, a thermal pressing process may be divided into two steps so as to increase the productivity (patent document 1). In this method, first, a plurality of chips is thermally pressed on a substrate one by one, which may be referred to as a preliminary bonding. Secondly, the plurality of chips is thermally pressed, which may be referred to as a main bonding. Using the mounting apparatus disclosed in patent document 1, during a main bonding, a plurality of pressing blocks is used to press a plurality of semiconductor chips simultaneously (refer to, e.g., FIG. 9 of patent document 1). Additionally, in order to absorb a height deviation of the pressing blocks, each pressing block may be supported so as to freely move up and down, and may be burdened by pressing an air press through an elastic layer.

CONVENTIONAL ART DOCUMENT

Patent Document

Patent document 1: Japanese Laid-open Patent Publication No. 2005-93838

SUMMARY

The applicant has reviewed the technique for dividing the thermal pressing into a preliminary bonding and a main bonding during a mounting process using a flip chip connection, and has found the following phenomenon. That is, when a chip is re-heated for the main bonding, the position of the chip may be dislocated, which may lower the quality of mounting, e.g., the exactness of the mounting density of chips.

Example embodiments provide a mounting apparatus and a mounting method in which the mounting quality may be enhanced when a plurality of semiconductor chips may be thermally pressed simultaneously.

According to example embodiments, there is provided a mounting apparatus for mounting a plurality of semiconductor chips on a connection part on a substrate and bonding the semiconductor chips with the connection part on the substrate by thermal pressing. The mounting apparatus includes a first pressing part and a second pressing part. The first pressing part mounts the semiconductor chips on the connection part on the substrate and preliminarily bonds the semiconductor chips with the connection part on the substrate by thermal pressing. The second pressing part mainly bonds the semiconductor chips preliminarily bonded by the first pressing part with the connection part on the substrate by thermal pressing for a time longer than that of the first pressing part. The second pressing part thermally presses the semiconductor chips preliminarily bonded with the connection part on the substrate in a state that the semiconductor chips are adsorbed on an adsorption surface of the second pressing part to be supported, the adsorption surface being substantially parallel to a loading surface of the substrate on which the semiconductor chips are loaded.

In example embodiments, the connection part on the substrate may be provided on another semiconductor chip bonded with the substrate.

According to example embodiments, there is provided a mounting method for mounting a plurality of semiconductor chips on a connection part on a substrate and bonding the semiconductor chips with the connection part on the substrate by thermal pressing. The mounting method includes a first pressing process and a second pressing process. The first pressing process mounts the semiconductor chips on the connection part on the substrate and preliminarily bonds the semiconductor chips with the connection part on the substrate by thermal pressing of a first pressing part. The second pressing process mainly bonds the semiconductor chips preliminarily bonded by the first pressing process with the connection part on the substrate by thermal pressing of a second processing part for a time longer than that of the first pressing process. The second pressing process thermally presses the semiconductor chips preliminarily bonded with the connection part on the substrate in a state that the semiconductor chips are adsorbed on an adsorption surface of the second pressing part to be supported, the adsorption surface being substantially parallel to a loading surface of the substrate on which the semiconductor chips are loaded.

In example embodiments, the connection part on the substrate may be provided on another semiconductor chip bonded with the substrate.

According to example embodiments, a plurality of semiconductor chips may be thermally pressed in a state that the plurality of semiconductor chips may be adsorbed on a loading surface of a substrate on which the semiconductor chips may be loaded, so that the dislocation of the semiconductor chips may be reduced.

BRIEF DESCRIPTION OF THE DRAWINGS

Example embodiments will be more clearly understood from the following detailed description taken in conjunction with the accompanying drawings.

FIGS. 1 to 4 represent non-limiting, example embodiments as described herein.

FIG. 1 is a plan view illustrating a mounting apparatus in accordance with example embodiments;

FIG. 3 is a side cross-sectional view illustrating the bonding state of the upper chip 4 and the lower chip 8; and FIG. 4 is a timing chart illustrating an operational example of a first movement part 6 and a second movement part 13 shown in FIG. 1.

DESCRIPTION OF EMBODIMENTS

Figure 1:
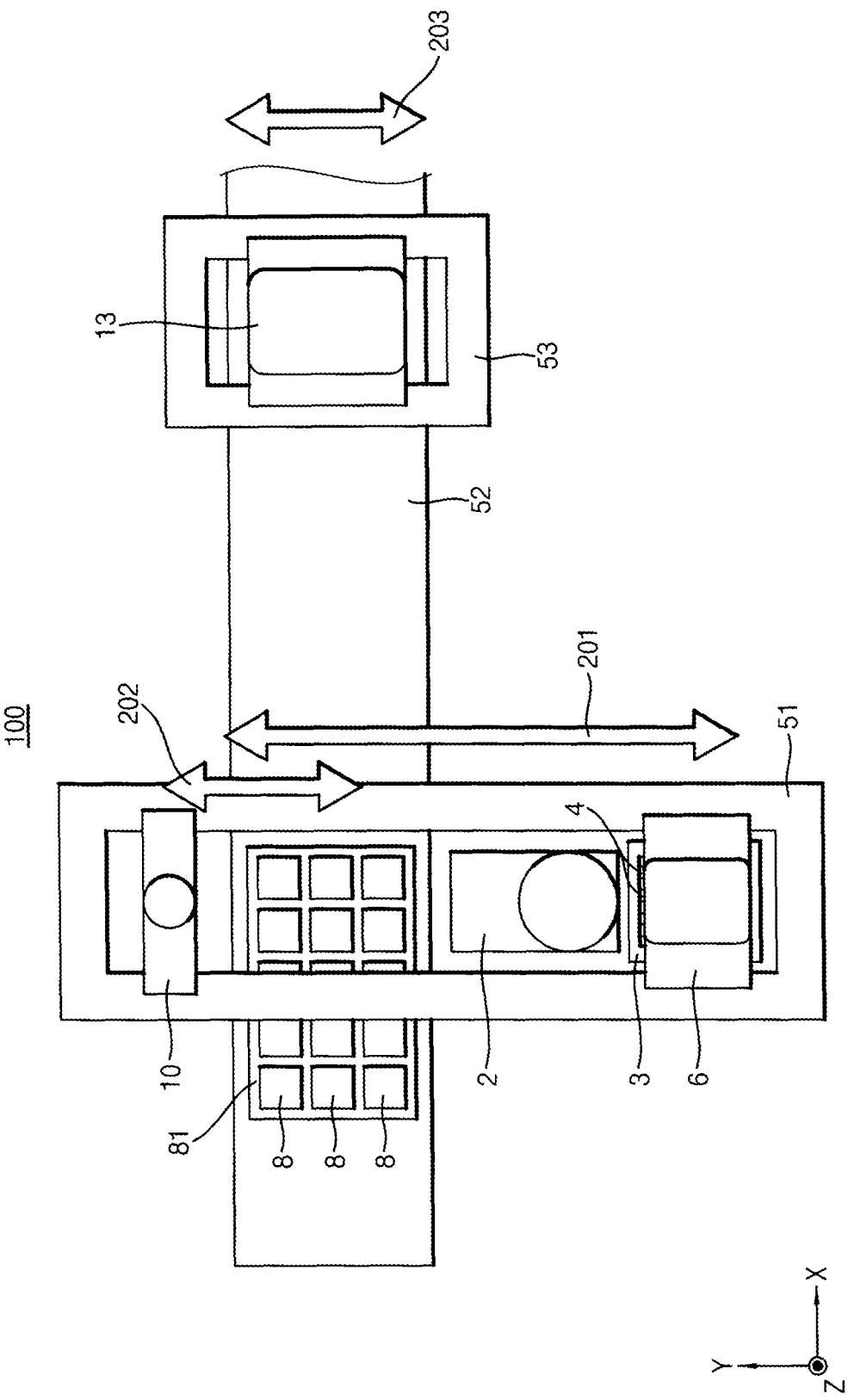

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2A:
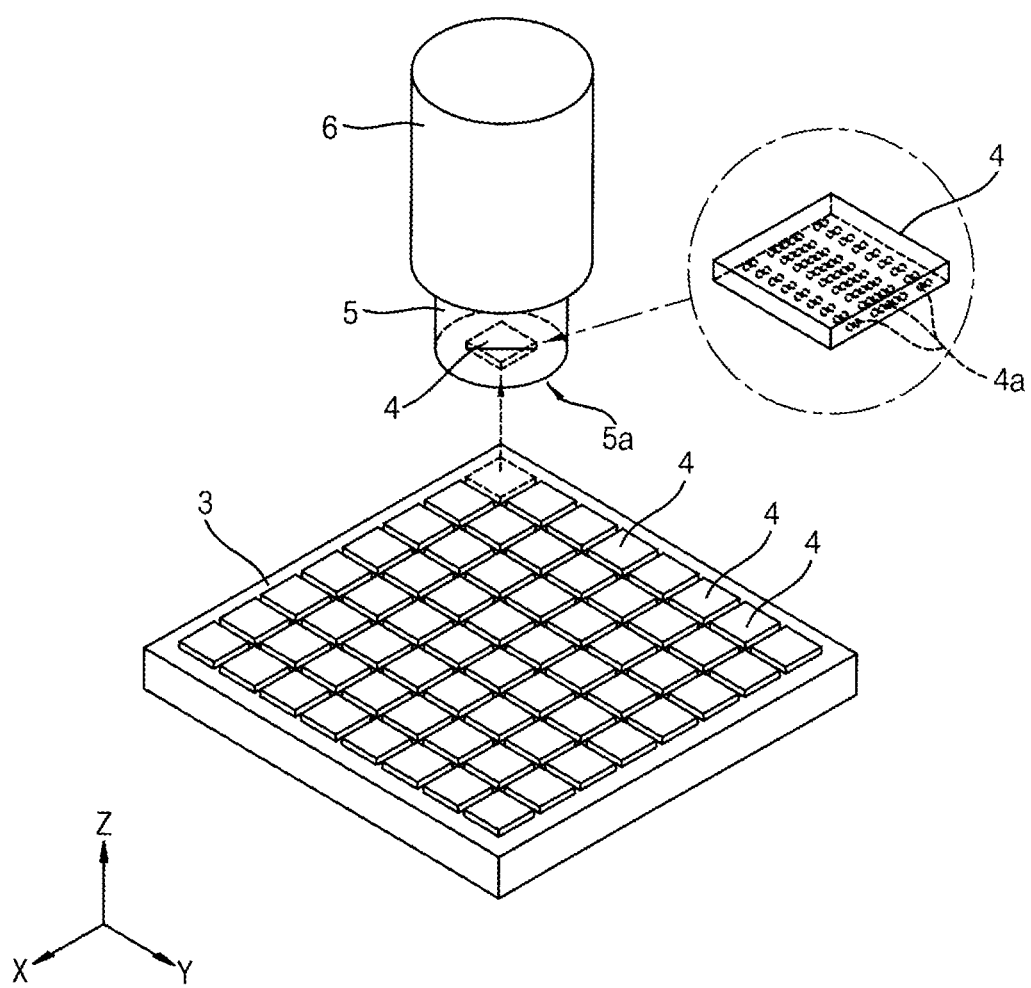
FIGS. 2A to 2C are perspective views illustrating positional relationships between a first movement part 6 and a second movement part 13 and an upper chip 4 and a lower chip 8, respectively, shown in FIG. 1.
Figure 2B:
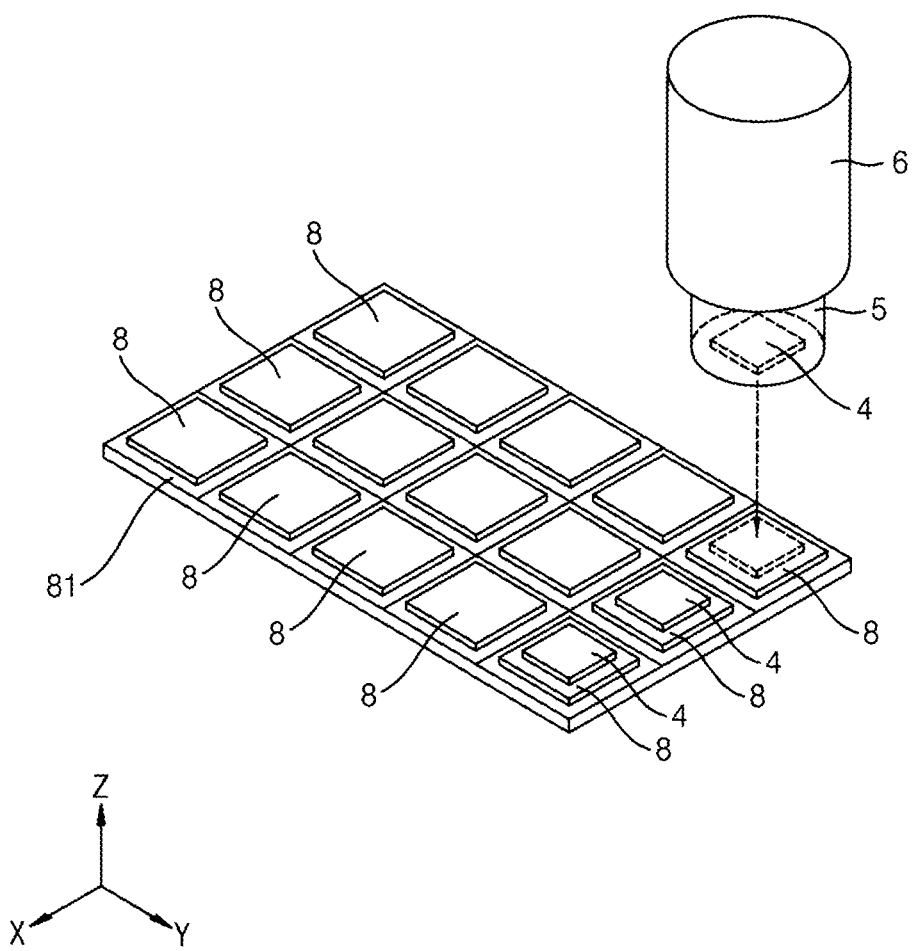
Figure 2C:
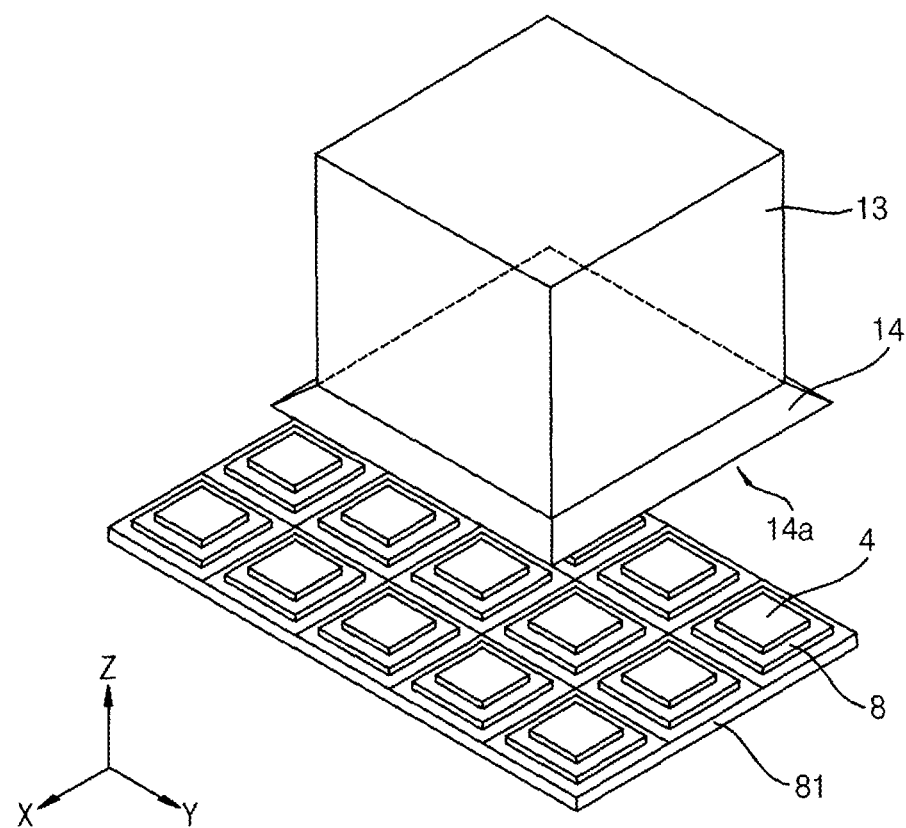

FIG. 1 is a plan view illustrating a mounting apparatus 100 in accordance with example embodiments. FIGS. 2A to 2C are perspective views illustrating positional relationships between a first movement part 6 and a second movement part 13 and an upper chip 4 and a lower chip 8, respectively, shown in FIG. 1.

As shown in FIG. 1 or FIGS. 2A to 2C, the mounting apparatus 100 may mount an upper chip 4, which has been previously flipped on a chip tray 3, on a lower chip 8. The lower chip 8 has been previously mounted on a substrate 81 by another mounting apparatus. The mounting apparatus 100 may include a chip camera 2, the first movement part 6, a place camera 10, the second movement part 13, a first gantry 51, a return plate 52 and a second gantry 53. The mounting apparatus 100 may return the substrate 81 on which a plurality of lower chips 8 has been previously mounted in an X direction. The mounting apparatus 100 may place the tray 3 flipping and containing a plurality of upper chips 4 at a given position. The mounting apparatus 100 may further include a computer for control (not shown), and perform a mounting process by controlling each part via performing a given program.

The first movement part 6 may adsorb the upper chip 4 contained in the chip tray 3 and return, or mount the upper chip 4 on the lower chip 8 and thermally press it. The first movement part 6, as shown in FIG. 2A, may have an adsorption tool 5 at a lower end thereof, and adsorb the upper chip 4 from the chip tray 3 and take it out. As enlargedly shown in FIG. 2A, the upper chip 4 may have a plurality of bumps 4a on a surface (in this case, on a surface opposite to an adsorption surface 5a of the adsorption tool 5). The adsorption tool 5 may adsorb one upper chip 4 by using a negative pressure. As shown in FIG. 1, the first movement part 6 may move over the first gantry 51 in an arrow direction 201, that is, in a Y direction. The first gantry 51 may be referred to as frame works, an assembly base, etc. The first movement part 6 may include a heater (not shown) therein, and as shown in FIG. 2B, may place the upper chip 4 on a given position of the lower chip 8 and thermally press it. In the present embodiment, a time for heating and pressing may be limited to a relatively short time. Thus, the upper chip 4 may be bonded on the lower chip 8 with a bonding force that may be less than a metal bonding force but may have a degree to which a position of the upper chip 4 may not be dislocated during a second thermal pressing. In the present embodiment, the above bonding may be referred to as a preliminary bonding.

The chip camera 2 may take a picture of a surface opposite to the adsorption surface 5a of the upper chip 4 adsorbed to an adsorption tool 5. The chip camera 2 may take a picture of a surface of the upper chip 4 that is opposite to the adsorption surface 5a when being returned, that is, a surface of the upper chip 4 on which a bump 4a is formed. Based on images taken by the chip camera 2, the position of the upper chip 4 may be recognized.

The place camera 10 may move over the first gantry 51 in an arrow direction 202, that is, in the Y direction. The place camera 10 may take a picture of a loading surface of the upper chip 4 on the lower chip 8. Based on images taken by the place camera 10, the loading position of the upper chip 4 on the lower chip 8, that is, the position of a plurality of connection terminals may be recognized. By matching the recognition of the position by the place camera 10 and the recognition of the position by the chip camera 2, the position of the first movement part 6 when the upper chip 4 is preliminarily bonded on the lower chip 8 may be corrected.

The second movement part 13 may thermally press again the plurality of upper chips 4 and the lower chips 8 preliminarily bonded with each other, that is, re-heat and re-press them. The substrate 81 on which the upper chip 4 has been preliminarily bonded with the lower chip 8 by the first movement part 6 may be returned to the second movement part 13 by the return plate 52. The second movement part 13 may move over the second gantry 53 in an arrow direction, that is, in the Y direction so as to correspond to a position of the plurality of upper chips 4 that may be thermally pressed. The second movement part 13, as shown in FIG. 2C, may have an adsorption tool 14 at an end portion thereof, and further include a heater (not shown) therein. The second movement part 13 may press and heat the upper and lower chips 4 and 8 in a state of adsorbing and supporting the plurality of upper chips 4 simultaneously. The adsorption tool 14 may include a porous metal, and may have an adsorption surface 14a that may be parallel to a loading surface of the substrate 81 on which the lower chip 8 is loaded and to a loading surface of the lower chip 8 on which the upper chip 4 is loaded. The porous metal may have a plurality of small pores, and may include various types of metal. A heat generated by an inner heater (not shown) may be transferred to a bonding part by the adsorption tool 14. The adsorption tool 14 may thermally press the upper and lower chips 4 and 8 in a state of adsorbing and supporting surfaces, that is, upper surfaces of the plurality of upper chips 4 preliminarily bonded with the adsorption surface 14a. In the present embodiment, a time for heating and pressing may be set up as relatively long when compared to that of the preliminary bonding. That is, the plurality of upper and lower chips 4 and 8 may be thermally pressed for a time longer than that of the preliminary bonding. Thus, the plurality of upper and lower chips 4 and 8 may be metal bonded by melting and coagulation of the bump 4a. In the present embodiment, this bonding may be referred to as a main bonding.

Figure 3:
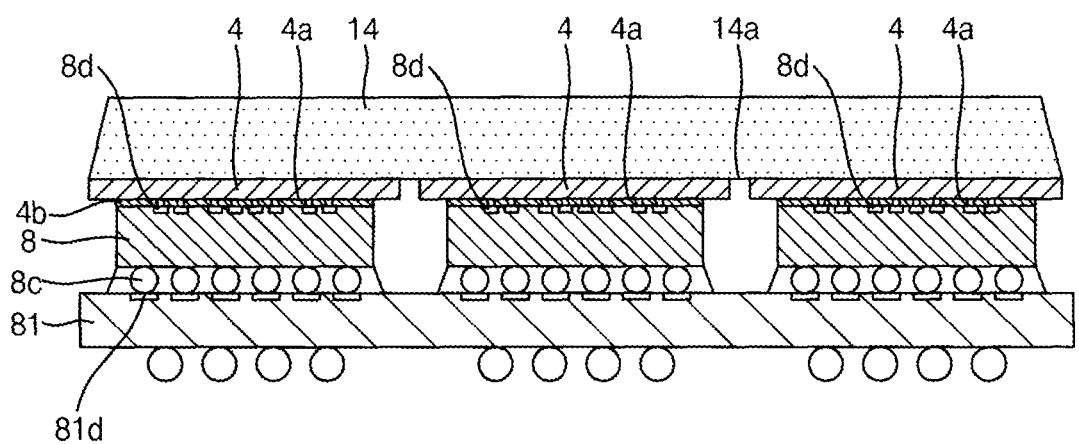

FIG. 3 shows the bonding state of the adsorption tool 14, the upper chip 4 and the lower chip 8 in the main bonding. In FIG. 3, a thermosetting resin 4b may be formed between the lower chip 8 and the upper chip 4. The lower chip 8 may have a plurality of bumps 8c on a surface opposite to a loading surface of the upper chip 4. The bump 4a may be connected to a corresponding connection terminal 8d on a surface of the lower chip 8. In the present embodiment, as shown in FIG. 3, a plurality of upper chips 4 may be thermally pressed to the connection terminal 8d on the lower chip 8 in a state that the whole upper surface of the upper chips 8 may be adsorbed to the adsorption surface 14a. Additionally, the plurality of bumps 8c on a surface of the lower chip 8 may be connected to the corresponding connection terminal 81d on a surface of the substrate 81. The lower chip 8 and the substrate 81 may be thermally pressed as the upper and lower chips 4 and 8. That is, the plurality of lower chips 8 may be simultaneously thermally pressed on the connection terminals 81d in a state that each upper surface of the lower chip 8 may be adsorbed to an adsorption surface of an adsorption tool.

FIG. 4 is a timing chart illustrating movements of the first movement part 6 in Y and Z directions and a movement of the second movement part 13 in the Z direction. In FIG. 4, a thermal pressing time for a preliminary bonding of one upper chip 4 by the first movement part 6 is about 2 seconds. A process time for a preliminary bonding of one upper chip 4 including a round-trip time of being taken out from the chip tray 3 and moving down toward the lower chip 8 by the first movement part 6 is about 3.3 seconds. Thus, a process time of 5 upper chips 4 is about 16.5 seconds. Meanwhile, a thermal pressing time for a main bonding of the plurality of upper chips 4 and the plurality of lower chips 8 preliminary bonded with each other by the second movement part 13 is about 16 seconds. A process time for a main bonding including a round-trip time of moving up and down, that is, a time of moving in the Z direction of the second movement part 13 is about 16.5 seconds. That is, in the present embodiment, the time for the preliminary bonding for five performances and the time of the main bonding for one performance may be almost the same. Thus, the production efficiency may be maximized when five times preliminary bondings and one time main bonding are matched.

In the present embodiment, the plurality of upper chips 4 and the plurality of lower chips 8 may be thermally pressed simultaneously in a state that the plurality of upper chips 4 are adsorbed to be supported by the adsorption tool 14 in the main bonding. In this case, the plurality of upper chips 4 may be thermally pressed in a state that the plurality of upper chips 4 may be adsorbed on the adsorption surface 14a substantially parallel to the loading surface of the plurality of lower chips 8 on which the upper chips 4 may be loaded. Additionally, the loading surface of the plurality of lower chips 8 on which the upper chips 8 may be loaded may be substantially parallel to the loading surface of the substrate 81 on which the lower chips 8 may be loaded. Thus, the dislocation of the chips 4 and 8 may not occur more than no adsorption is performed. Additionally, the thermal pressing process for the lower chips 8 may be also divided into a preliminary bonding and a main bonding when the lower chips 8 and the substrate 81 are thermally pressed, and further, the upper surfaces of the plurality of lower chips 8 may be adsorbed to be supported simultaneously by a device such as the adsorption tool 14. In this case, the dislocation of the plurality of lower chips 8 may less occur when the plurality of lower chips 8 and the substrate 81 are thermally pressed.

In the present embodiment, the adsorption tool 14 may include a porous metal so as to increase the heat conduction and to miniaturize the device.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A mounting apparatus for mounting a plurality of first semiconductor chips on second semiconductor chips on a substrate and bonding the first semiconductor chips with the second semiconductor chips on the substrate by thermal pressing, the mounting apparatus comprising:
   a first pressing part configured to mount the first semiconductor chips on the second semiconductor chips on the substrate and preliminarily bond the first semiconductor chips with the second semiconductor chips on the substrate by thermal pressing; and
   a second pressing part configured to mainly bond the first semiconductor chips preliminarily bonded by the first pressing part with the second semiconductor chips on the substrate by thermal pressing for a time longer than that of the first pressing part,
   wherein the second pressing part is configured to thermally press the first semiconductor chips preliminarily bonded with the second semiconductor chips on the substrate in a state that the first semiconductor chips are adsorbed on an adsorption surface of the second pressing part to be supported, the adsorption surface being substantially parallel to a loading surface of the substrate on which the first semiconductor chips are loaded.

2. The mounting apparatus of claim 1, wherein the first pressing part includes a first movement part, which is configured to adsorb and move the first semiconductor chips onto the second semiconductor chips on the substrate.

3. The mounting apparatus of claim 2, wherein the first movement part includes an adsorption tool, and the adsorption tool includes an adsorption surface configured to adsorb the first semiconductor chips.

4. The mounting apparatus of claim 3, wherein the adsorption tool includes a porous metal.

5. The mounting apparatus of claim 3, wherein the adsorption surface is parallel to a loading surface of the substrate on which the second semiconductor chips are loaded.

6. The mounting apparatus of claim 3, wherein the first pressing part includes,
   a chip camera configured to take picture of a surface opposite to an adsorption surface of the first semiconductor chips adsorbed to the adsorption tool, and
   a place camera configured to take picture of a loading surface of the first semiconductor chips on the substrate.

7. The mounting apparatus of claim 6, wherein the first pressing part is configured to correct a position of the first pressing part by matching positions of a first position recognized by the place camera with respect to a second position recognized by the chip camera.

8. The mounting apparatus of claim 1, wherein the second pressing part is configured to thermally press the first semiconductor chips onto the second semiconductor chips simultaneously.

9. The mounting apparatus of claim 8, wherein the first movement part includes an adsorption tool, and the adsorption tool includes an adsorption surface configured to adsorb the first semiconductor chips, and the adsorption surface is parallel to a loading surface of the second semiconductors on which the first semiconductor chips are loaded.

10. A mounting method for mounting a plurality of first semiconductor chips on second semiconductor chips on a substrate and bonding the first semiconductor chips with the second semiconductor chips on the substrate by thermal pressing, the mounting method comprising:
    a first pressing process for mounting the first semiconductor chips on the second semiconductor chips on the substrate and preliminarily bonding the first semiconductor chips with the second semiconductor chips on the substrate by thermal pressing of a first pressing part; and
    a second pressing process for mainly bonding the first semiconductor chips preliminarily bonded by the first pressing process with the second semiconductor chips on the substrate by thermal pressing of a second processing part for a time longer than that of the first pressing process,
    wherein the second pressing process thermally presses the first semiconductor chips preliminarily bonded with the second semiconductor chips on the substrate in a state that the first semiconductor chips are adsorbed on an adsorption surface of the second pressing part to be supported, the adsorption surface being substantially parallel to a loading surface of the substrate on which the first semiconductor chips are loaded.

11. The mounting method of claim 10, further comprising:
    correcting a position of the first pressing part by measuring and comparing a position of a first surface opposite to a second surface of the first semiconductor chips attached to the first pressing part and a position of a loading surface of the second semiconductor chips on the substrate.

12. The mounting method of claim 10, wherein the second pressing process thermally presses the first semiconductor chips onto the second semiconductor chips simultaneously.

13. The mounting method of claim 10, wherein a time for performing the first pressing process five times is substantially equal to a time for performing the second pressing process once.

* * * * *